United States Patent
Nakajima et al.

(10) Patent No.: US 10,539,879 B2
(45) Date of Patent: Jan. 21, 2020

(54) OPTICAL APPARATUS, EXPOSURE APPARATUS, METHOD OF MANUFACTURING OPTICAL APPARATUS, AND METHOD OF MANUFACTURING ARTICLE

(71) Applicant: CANON KABUSHIKI KAISHA, Tokyo (JP)

(72) Inventors: Takeshi Nakajima, Utsunomiya (JP); Satoshi Tomura, Utsunomiya (JP); Masato Hagiri, Utsunomiya (JP); Mitsuru Seki, Chikusei (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/390,262

(22) Filed: Apr. 22, 2019

(65) Prior Publication Data

US 2019/0332016 A1    Oct. 31, 2019

(30) Foreign Application Priority Data

Apr. 26, 2018    (JP) .................................. 2018-085720

(51) Int. Cl.
*G03B 27/72*    (2006.01)
*G03F 7/20*    (2006.01)
*G02B 7/198*    (2006.01)
*G03F 7/26*    (2006.01)

(52) U.S. Cl.
CPC ............ *G03F 7/7015* (2013.01); *G02B 7/198* (2013.01); *G03F 7/20* (2013.01); *G03F 7/26* (2013.01); *G03F 7/70591* (2013.01)

(58) Field of Classification Search
CPC .............. G03F 7/70825; G03F 7/7015; G03F 7/70591; G03F 7/20; G03F 7/26; G02B 7/198
See application file for complete search history.

(56) References Cited

U.S. PATENT DOCUMENTS

2006/0198036 A1*  9/2006  Murasato ............... G02B 7/026
                                                    359/819
2007/0146663 A1*  6/2007  Nagasaka ............. G03F 7/2041
                                                    355/53

FOREIGN PATENT DOCUMENTS

JP    2001242364 A    9/2001

* cited by examiner

*Primary Examiner* — Peter B Kim
(74) *Attorney, Agent, or Firm* — Rossi, Kimms & McDowell LLP

(57) ABSTRACT

An optical apparatus includes an optical component, a support mechanism configured to support the optical component, a manipulation mechanism configured to manipulate the optical component while contacting the optical component such that a state of the optical component is changed. The optical component is changed by the manipulation mechanism from a first state in which the optical component is supported by the support mechanism to a second state in which the optical component is supported by the manipulation mechanism.

14 Claims, 10 Drawing Sheets

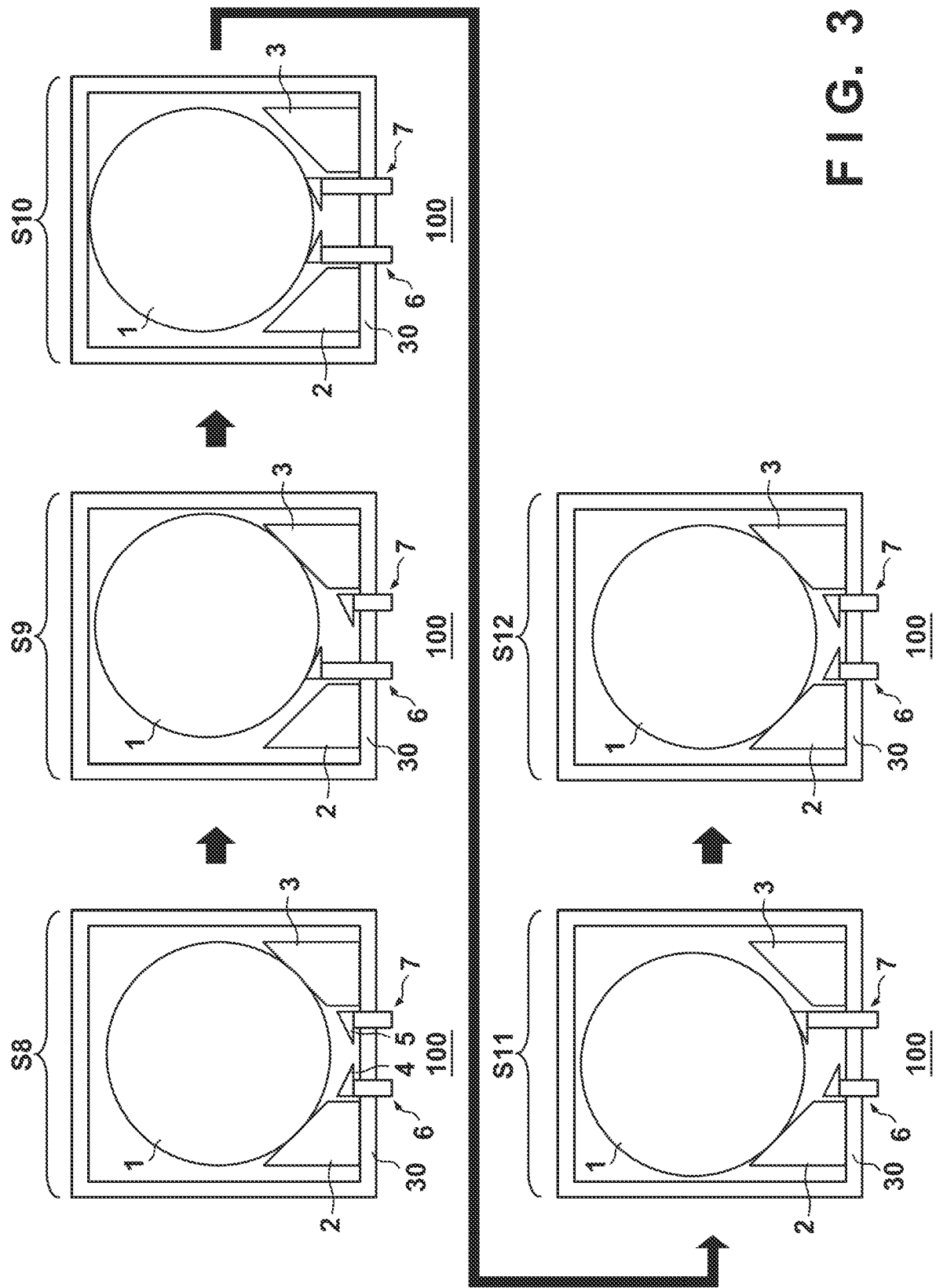

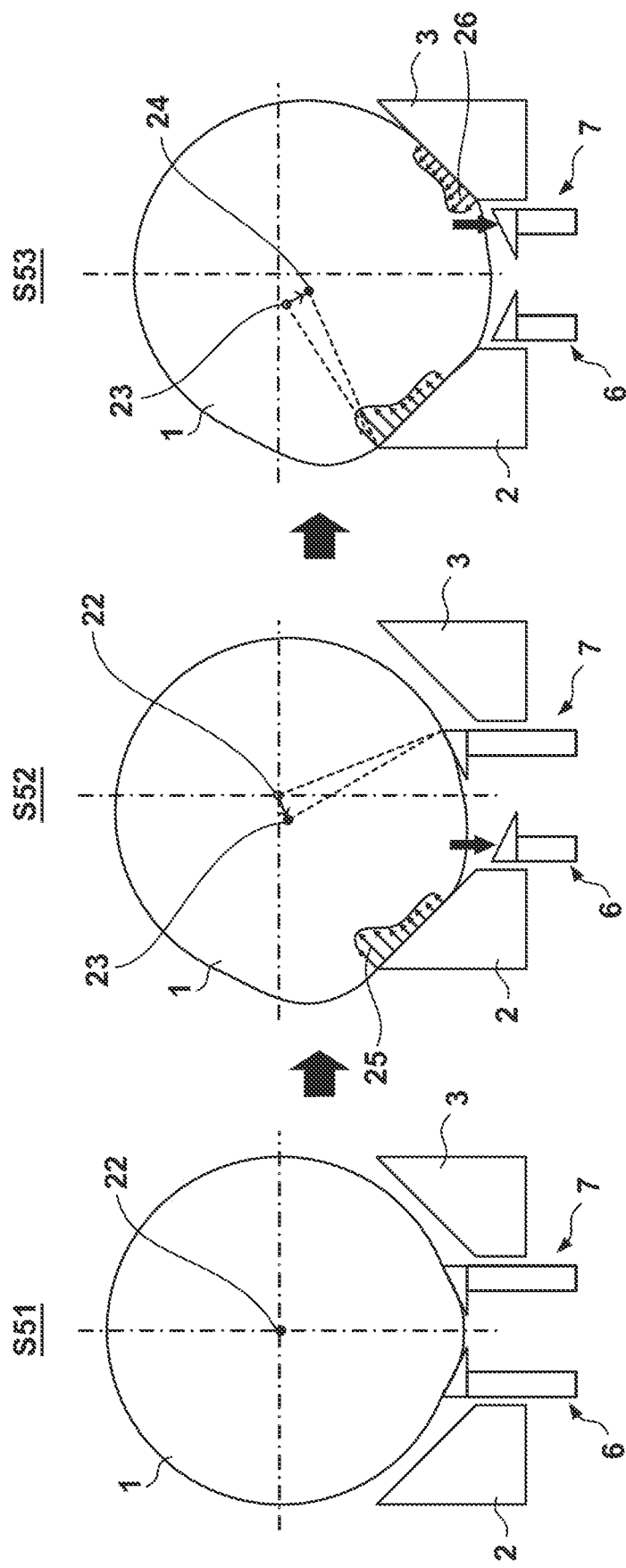

ns 2 and 3. FIG. 10 schematically shows the
OPTICAL APPARATUS, EXPOSURE APPARATUS, METHOD OF MANUFACTURING OPTICAL APPARATUS, AND METHOD OF MANUFACTURING ARTICLE

BACKGROUND OF THE INVENTION

Field of the Invention

The present invention relates to an optical apparatus, an exposure apparatus, a method of manufacturing the optical apparatus, and a method of manufacturing an article.

Description of the Related Art

In an optical apparatus in which an optical component such as a lens or a mirror is held by a holding mechanism, the optical component can deform under stress due to its own weight or the like. For example, Japanese Patent Laid-Open No. 2001-242364 describes that in an arrangement in which a lens and a lens installation portion are in contact with each other at a plurality of points, there is a possibility that the lens deforms and the optical characteristics deteriorate.

It is inevitable that the optical component deforms due to its own weight, but it is possible to adjust the optical characteristics of the optical apparatus including the optical component while taking the deformation of the optical component into consideration. However, when the optical apparatus is adjusted before shipment and readjusted after shipment, if the deformation state of the optical component is different between before shipment and after shipment, the significance of adjustment before shipment is reduced and it can take a long time for readjustment after shipment.

SUMMARY OF THE INVENTION

The present invention provides a technique advantageous in shortening the time required for readjustment of an optical apparatus.

One of aspects of the present invention provides an optical apparatus including an optical component and a support mechanism configured to support the optical component, comprising: a manipulation mechanism configured to manipulate the optical component while contacting the optical component such that a state of the optical component is changed, wherein the optical component is changed by the manipulation mechanism from a first state in which the optical component is supported by the support mechanism to a second state in which the optical component is supported by the manipulation mechanism.

Further features of the present invention will become apparent from the following description of exemplary embodiments with reference to the attached drawings.

BRIEF DESCRIPTION OF THE DRAWINGS

FIG. 3 is a view illustrating a stress reduction operation;

FIG. 5 is a view for explaining deformation of an optical component occurring depending on manipulation of an optical component by a manipulation mechanism;

DESCRIPTION OF THE EMBODIMENTS

The present invention will now be described through exemplary embodiments thereof with reference to the accompanying drawings.

Figure 10:
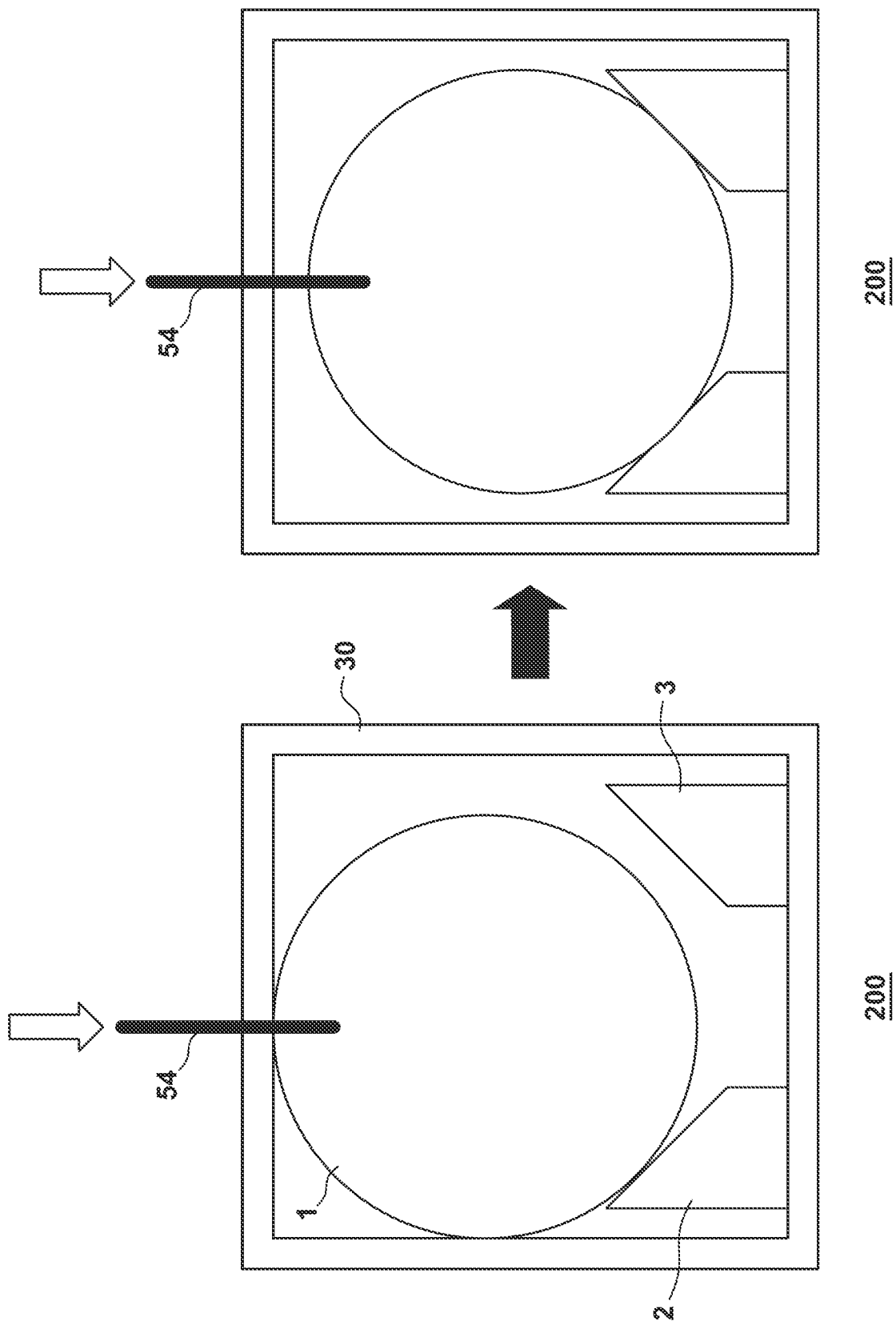
FIG. 10 is a view for explaining problems.
Figure 11:
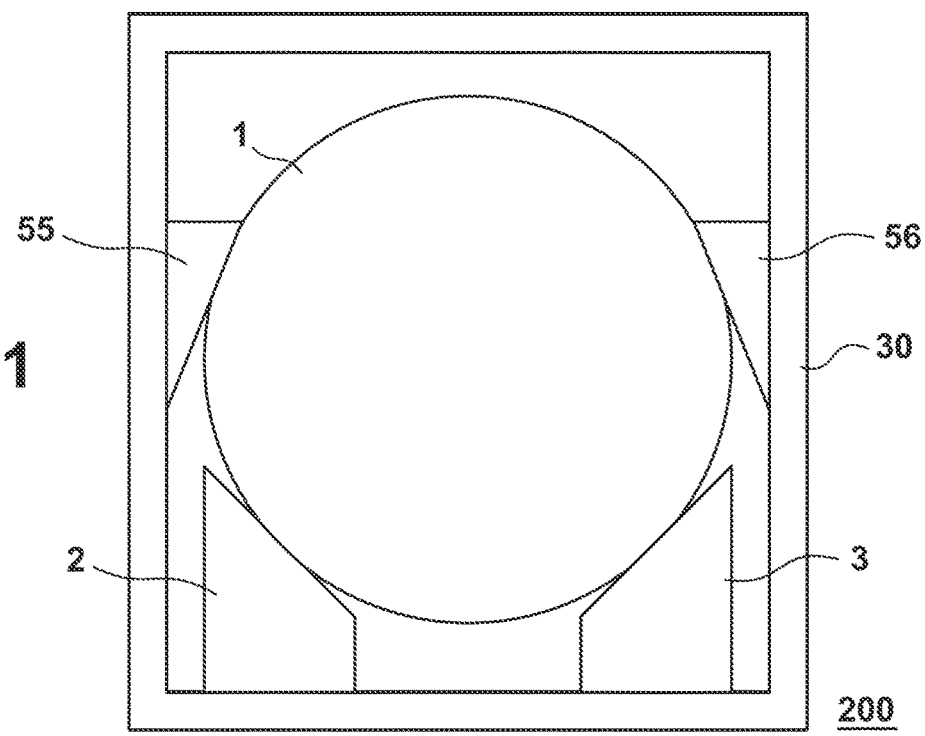
FIG. 11 is a view for explaining the problems.
Figure 12:
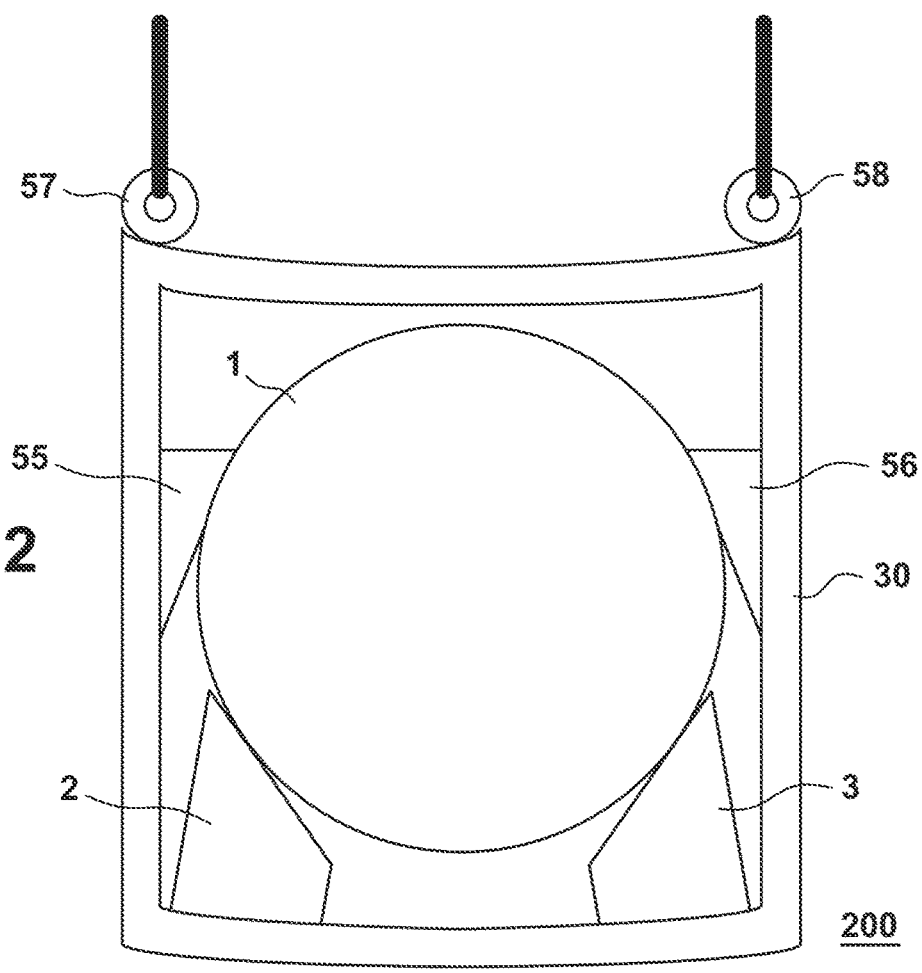
FIG. 12 is a view for explaining the problems.

First, problems will be described with reference to FIGS. 10, 11, and 12. Note that an optical apparatus 200 shown in FIGS. 10, 11, and 12 is merely a reference example for explaining the problems, and does not show a known optical apparatus. The optical apparatus 200 can include an optical component 1, support mechanisms 2 and 3 for supporting the optical component 1, and a chamber 30 (enclosing member) for enclosing the optical component 1. Frictional forces are generated between the optical component 1 and the support mechanisms 2 and 3. The magnitude and direction of the frictional force can change depending on the procedure (order) of mounting the optical component 1 on the support mechanisms 2 and 3 and the amount of movement of the optical component 1 upon mounting the optical component 1 on the support mechanisms 2 and 3. The assembly operation of the optical apparatus 200 can include, for example, an operation of lifting the optical component 1 by human power or a crane and lowering it onto the support mechanisms 2 and 3. FIG. 10 schematically shows the operation of lifting the optical component 1 with a crane 54 and lowering it onto the support mechanisms 2 and 3. In the example shown in FIG. 10, the optical component 1 is lowered onto the support mechanisms 2 and 3 in a state in which it is shifted to the left side (the side of the support mechanism 2). Therefore, the optical component 1 first comes into contact with the left support mechanism 2 out of the support mechanisms 2 and 3. Even if it is intended that the position of the crane 54 is completely aligned with the target position, the position of the crane 54 always deviates from the target position on the micrometer order. Accordingly, the frictional force acting on the optical component 1 lowered onto the support mechanisms 2 and 3 and supported by the support mechanisms 2 and 3 can change each time the optical component 1 is lowered onto the support mechanism 2 and 3.

After the optical component 1 is lowered onto the support mechanisms 2 and 3 and supported by the support mechanisms 2 and 3, the optical performance of the optical apparatus 200 can be checked and adjusted to meet the specification. Thereafter, the optical apparatus 200 can be prepared (for example, packed and fixed) for transportation and transported (shipped). The transportation of the optical apparatus 200 may be performed in a state in which all or part thereof is disassembled. FIG. 11 schematically shows the optical apparatus 200 at the time of transportation. At the time of transportation, the optical component 1 can be fixed with fixing components 55 and 56. By fixing the optical component 1 with the fixing components 55 and 56, breakage of the optical component 1 at the time of transportation can be prevented. However, by fixing the optical component 1 with the fixing components 55 and 56, forces are applied to the optical component 1 so that the optical component 1 can deform. In addition, an impact is applied to the optical apparatus 200 during transportation so that the optical component 1 can deform. Further, at the time of transportation, since the temperature of the optical apparatus 200 can change, the optical component 1 can deform due to the difference in thermal expansion between the optical component 1 and the support mechanisms 2 and 3. Furthermore, as schematically shown in FIG. 12, when the optical apparatus 200 is lifted by a crane in loading, unloading, and the like for transportation, the chamber 30 can deform due to its own weight with lifting hooks 57 and 58 as supporting points.

For the reasons described above, various deformations may occur in the optical component 1 in preparation for transportation (packing and fixing), loading, transportation, unloading, and the like. Therefore, the state of the optical apparatus 200 or the optical component 1 (the deformation state of the optical component 1) can be greatly different between the time of adjustment before shipment and the time of installation at the shipping destination after shipment. Further, when the optical apparatus 200 is transported in a state in which all or part thereof is disassembled, the optical apparatus 200 can be assembled at a transportation destination or an installation destination. Even with such disassembling and assembling, the state of the optical apparatus 200 or the optical component 1 (the deformation state of the optical component 1) can be greatly different between the time of adjustment before shipment and the time of installation at the shipping destination after shipment.

Therefore, the optical characteristics of the optical apparatus 200 can be readjusted at the shipping destination. This adjustment can include adjustment of the position of the optical component 1. Further, in the optical apparatus 200 including an adjustment optical element, adjustment can be performed by processing the adjustment optical element. A suitable time or number of days is required for processing the adjustment optical element at the factory of the shipping source, transporting it to the shipping destination, and incorporating it into the optical apparatus 200.

As described above, in the reference example, there is a possibility that the optical characteristics of the optical apparatus 200 are greatly different between the time of completion of adjustment before shipment and the time of installation at the shipping destination, and it can take a long time to readjust the optical characteristics of the optical apparatus 200 at the shipping destination. The following embodiments are made in view of these problems.

Figure 1:
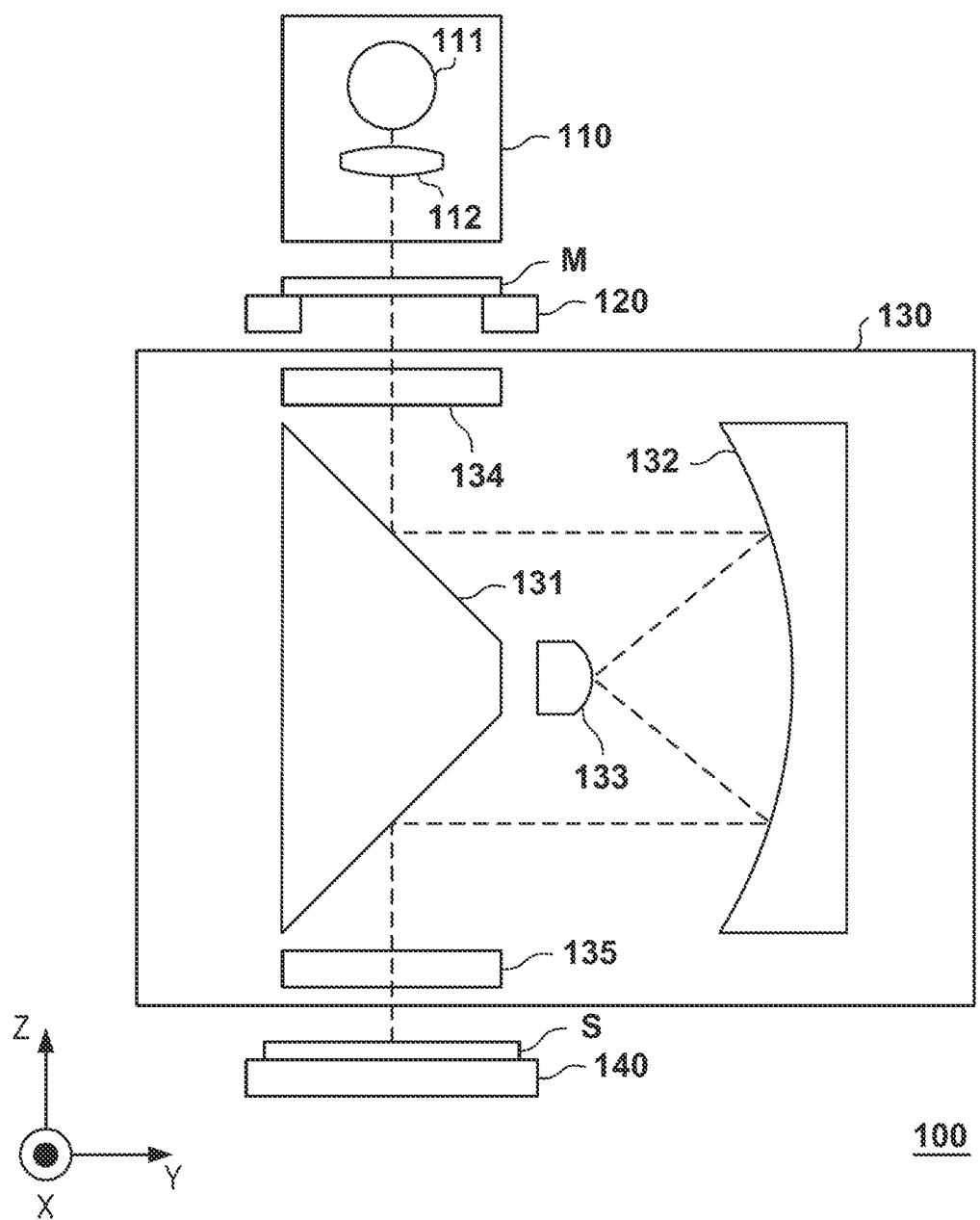
FIG. 1 is a view schematically showing the arrangement of an exposure apparatus as an optical apparatus according to an embodiment of the present invention.

FIG. 1 schematically shows the arrangement of an exposure apparatus as an optical apparatus 100 according to an embodiment of the present invention. The optical apparatus 100 can be configured to project and transfer the pattern of an original (reticle) M onto a photosensitive agent (photoresist) applied on a substrate S. Note that the optical apparatus 100 may be configured as an optical apparatus other than an exposure apparatus, for example, a telescope, a processing apparatus, or the like.

The optical apparatus 100 can include an illumination optical system 110, an original driving mechanism 120, a projection optical system 130, and a substrate driving mechanism 140. The illumination optical system 110 is configured to illuminate the original M. The illumination optical system 110 can include a light source 111 and one or a plurality of optical components 112 for illuminating the original M with light from the light source 111. The original driving mechanism 120 is configured to hold and drive the original M.

The projection optical system 130 is configured to project the pattern of the original M illuminated by the illumination optical system 110 onto the substrate S. The projection optical system 130 can include optical components 131, 132, and 133. The optical component 131 can include two reflecting surfaces for bending the optical path. The optical component 132 can be a concave mirror. The optical component 133 can be a convex mirror. All or some of the plurality of optical components constituting the projection optical system 130 may be refractive optical components. The projection optical system 130 may include an optical component 134 arranged between the original driving mechanism 120 and the optical component 131 and/or an optical component 135 arranged between the optical component 131 and the substrate driving mechanism 140. The optical components 134 and 135 can be refractive optical components. The optical components 134 and 135 may include adjustment optical components for adjusting the optical characteristics of the projection optical system 130.

Figure 2:
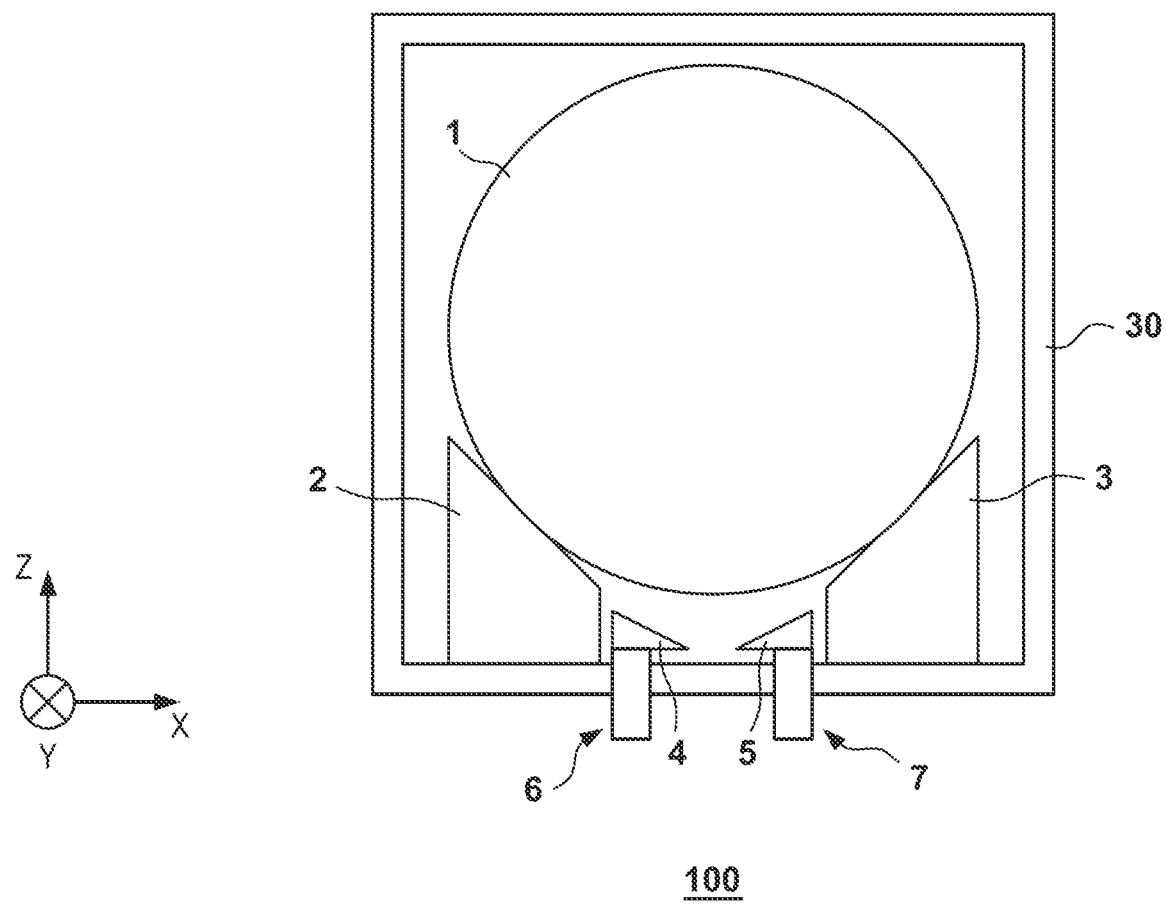
FIG. 2 is a view schematically showing the arrangement of the optical apparatus according to the embodiment of the present invention.

FIG. 2 schematically shows the arrangement of the optical apparatus 100 according to the embodiment of the present invention. The optical apparatus 100 shown in FIG. 2 can constitute, for example, all or part of the optical apparatus 100 shown in FIG. 1. The optical apparatus 100 can include an optical component 1, support mechanisms 2 and 3 which support the optical component 1, and manipulation mechanisms 6 and 7 which manipulate the optical component 1 while contacting the optical component 1 so as to change the state of the optical component 1. The manipulation mechanisms 6 and 7 can be configured to be capable of manipulating the optical component 1 so as to reduce the stress in the optical component 1. The optical apparatus 100 can include a chamber 30 (enclosing member) for enclosing the optical component 1. The manipulation mechanisms 6 and 7 can be configured to be capable of changing the state of the optical component 1 arranged in the chamber 30.

There can be one or a plurality of the support mechanisms 2 and 3. There can be one or a plurality of the manipulation mechanisms 6 and 7. The state of the optical component 1 can include a first state in which the optical component 1 is supported by the support mechanisms 2 and 3 and a second state in which the optical component 1 is supported by the manipulation mechanisms 6 and 7. In the first state, the optical component 1 can be supported by only the support mechanisms 2 and 3. The second state can include a third state in which the optical component 1 is supported by at least one of the plurality of support mechanisms 2 and 3 and at least one of the manipulation mechanisms 6 and 7. The second state can further include a fourth state in which the optical component 1 is supported by at least one of the plurality of manipulation mechanisms 6 and 7 but not by the support mechanisms 2 and 3.

The manipulation mechanism 6 can include a driving mechanism (actuator) for driving the optical component 1. This driving mechanism can be configured to drive a support portion 4 for supporting the optical component 1. The manipulation mechanism 7 can include a driving mechanism (actuator) for driving the optical component 1. This driving mechanism can be configured to drive a support portion 5 for supporting the optical component 1.

FIG. 3 illustrates an assembly procedure (or adjustment procedure) of the optical apparatus 100 before shipment and after shipment. Here, the assembly procedure (or adjustment procedure) of the optical apparatus 100 before shipment and the assembly procedure (or adjustment procedure) of the optical apparatus 100 after shipment can be the same. In step S8, the optical component 1 is supported by the support mechanisms 2 and 3. In step S8, the optical component 1 is lowered onto the support mechanisms 2 and 3 by, for example, human power or an external device such as a crane so that the optical component 1 can be supported by the support mechanisms 2 and 3. As described in the description of the problems, the frictional force acting on the optical component 1 immediately after being lowered onto and supported by the support mechanisms 2 and 3 can change each time the optical component 1 is lowered onto the support mechanisms 2 and 3.

Accordingly, after the first state in which the optical component 1 is lowered onto the support mechanisms 2 and 3 by human power or an external device such as a crane and supported by the support mechanisms 2 and 3, the state of the optical component 1 can be changed to the second state in which the optical component 1 is supported by the manipulation mechanisms 6 and 7, and then returned to the first state. The operation of changing the state of the optical component 1 from the first state to the second state and then returning it to the first state can be performed in the same manner each time in accordance with a predetermined specification. The specification can include multiple changes of the state of the optical component 1. In addition, the specification can include a designation of the execution order of multiple changes (driving procedure of the manipulation mechanisms 6 and 7) and a designation of the movement amount of the optical component 1 by the manipulation mechanisms 6 and 7. In the assembly procedure (or adjustment procedure) of the optical apparatus 100 before shipment and in the assembly procedure (or adjustment procedure) of the optical apparatus 100 after shipment, the state of the optical component 1 can be changed from the first state to the second state and then returned to the first state in accordance with the same specification. Here, the operation of changing the state of the optical component 1 from the first state to the second state and then returning it to the first state is referred to as a stress reduction operation.

By executing the stress reduction operation in accordance with the same specification before shipment and after shipment, it is possible to decrease the difference between the state of the optical apparatus 100 (the stress in the optical component 1) before shipment and the state of the optical apparatus 100 (the stress in the optical component 1) after shipment. Therefore, the manipulation mechanisms 6 and 7 change the state of the optical component 1 in accordance with the specification prior to the adjustment before shipment of the optical apparatus 100 and, after shipment of the optical apparatus 100, they change the state of the optical component 1 in accordance with the specification prior to the adjustment after shipment of the optical apparatus 100. Here, the second state can include the third state in which the optical component 1 is supported by at least one of the plurality of support mechanisms 2 and 3 and at least one of the plurality of manipulation mechanisms 6 and 7. The second state can further include the fourth state in which the optical component 1 is supported by at least one of the plurality of manipulation mechanisms 6 and 7 but not by the support mechanisms 2 and 3. The manipulation mechanisms 6 and 7 may change the state of the optical component 1 in the order of the first state, the third state, the fourth state, the third state, and the first state.

FIG. 3 shows an example in which the manipulation mechanisms 6 and 7 change the state of the optical component 1 in the order of the first state, the third state, the fourth state, the third state, and the first state. Step S8 corresponds to the first state, step S9 corresponds to the third state, step S10 corresponds to the fourth state, step S11 corresponds to the third state, and step S12 corresponds to the first state. In step S8, the optical component 1 is supported by the support mechanisms 2 and 3 but not by the manipulation mechanisms 6 and 7. In step S9, the optical component 1 is supported by the support mechanism 3 out of the support mechanism 2 and 3 and by the manipulation mechanism 6 out of the manipulation mechanisms 6 and 7. In step S10, the optical component 1 is supported by the manipulation mechanisms 6 and 7 but not by the support mechanisms 2 and 3. In step S11, the optical component 1 is supported by the support mechanism 2 out of the support mechanisms 2 and 3 and by the manipulation mechanism 7 out of the manipulation mechanisms 6 and 7. In step S12, the optical component 1 is supported by the support mechanisms 2 and 3 but not by the manipulation mechanisms 6 and 7.

After the assembly procedure of the optical apparatus 100 before shipment is performed in accordance with the specification illustrated in FIG. 3, pre-shipment check and pre-shipment adjustment can be performed. In the pre-shipment check, the optical characteristics (for example, various aberrations) of the optical apparatus 100 are checked. As a result of the pre-shipment check, if the optical characteristics of the optical apparatus 100 meet the standard, the optical apparatus 100 can be shipped (transported) to the shipping destination after an operation for shipping (transportation). As a result of the pre-shipment check, if the optical characteristics of the optical apparatus 100 do not meet the standard, pre-shipment adjustment can be performed. In the pre-shipment adjustment, the optical characteristics (for example, various aberrations) of the optical apparatus 100 are adjusted. The pre-shipment adjustment can include, for example, adjustment of the position or posture (inclination) of the optical component 1. The pre-shipment adjustment can be performed such that the optical characteristics of the optical apparatus 100 meet the standard. When the optical apparatus 100 includes an adjustment optical component, the pre-shipment adjustment can include processing the adjustment optical component. For example, when the optical apparatus 100 as illustrated in FIG. 1 is to be adjusted, the pre-shipment adjustment can include processing at least one of the optical components 134 and 135 as an adjustment optical component.

When the pre-shipment adjustment is completed, the optical apparatus 100 is prepared (for example, packed and fixed) for transportation and then transported (shipped). That is, the optical apparatus 100 undergoes packing, fixing, transportation, lifting, and the like. Due to this, the optical component 1 deforms, and the optical characteristics of the optical apparatus 100 deviate from the optical characteristics at the time of completion of the pre-shipment adjustment.

However, in this embodiment, after the optical apparatus 100 is transported to the shipping destination, the assembly procedure of the optical apparatus 100 after shipment is performed in accordance with the specification illustrated in FIG. 3 in the same manner as the assembly procedure of the optical apparatus 100 before shipment. Accordingly, the state of the optical apparatus 100 returns to a state that is almost the same as the state immediately after the stress reduction operation before shipment or the state immediately after pre-shipment adjustment. For example, when the optical apparatus 100 shown in FIG. 1 is to be adjusted and at least one of the optical components 134 and 135 is processed as an adjustment optical component, by incorporating the adjustment optical component into the optical apparatus 100, the optical apparatus 100 can exhibit the optical characteristics that meet the standard. Therefore, it is not necessary to process the adjustment optical component after shipment.

Figure 4A:
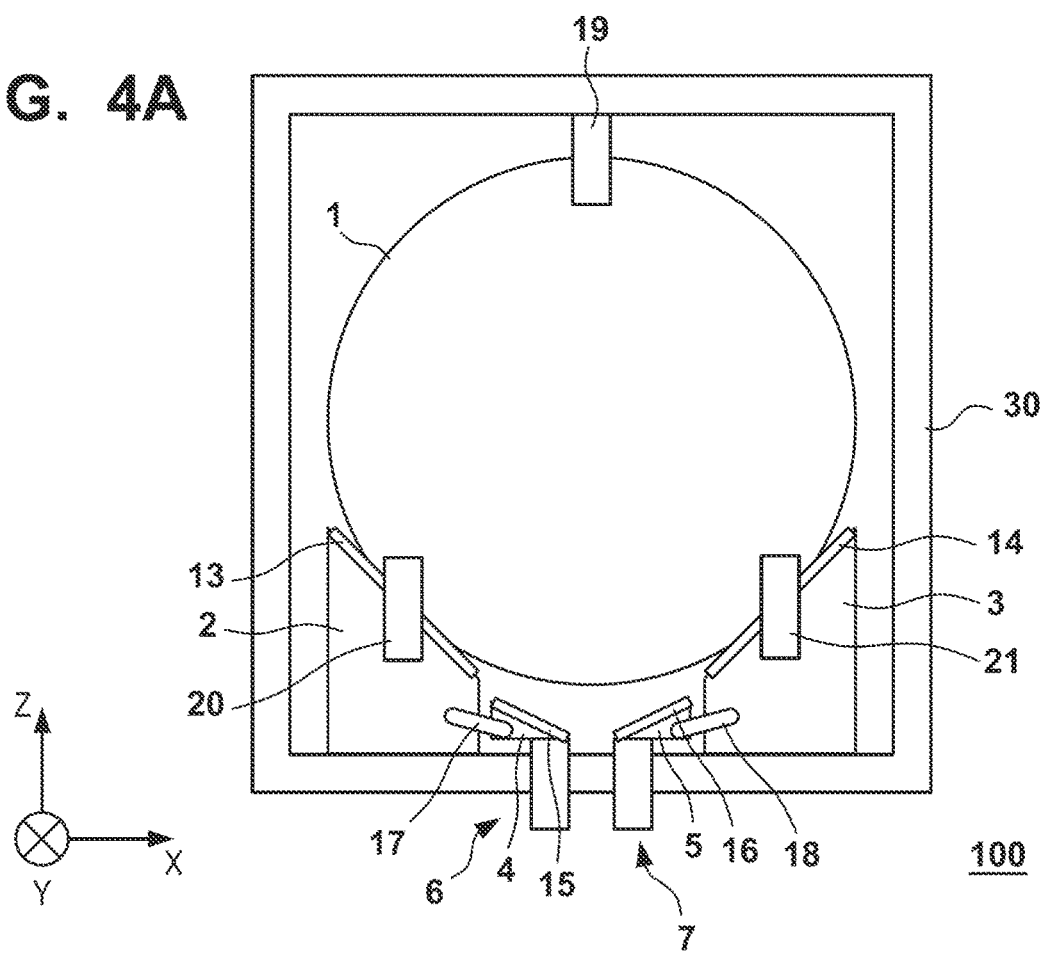
FIGS. 4A and 4B are views schematically showing an example of the present invention.
Figure 4B:
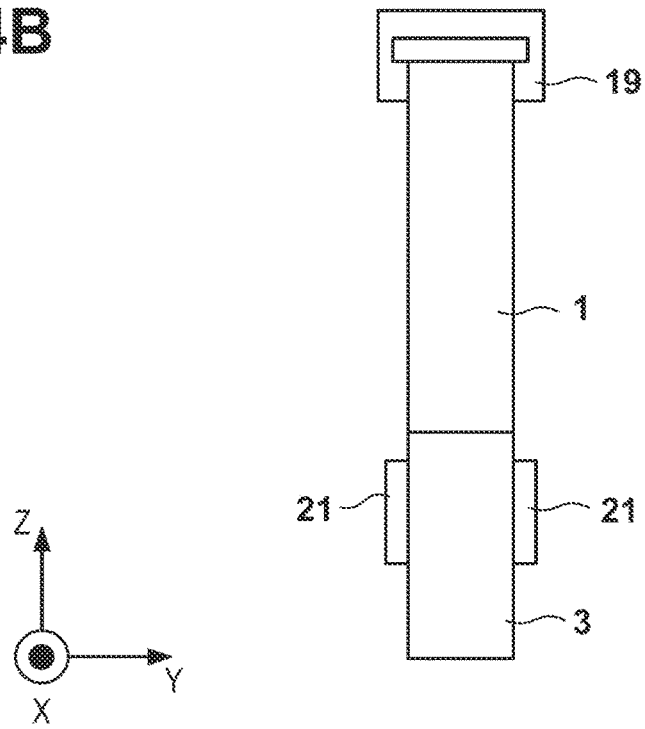

Referring to FIGS. 4A, 4B, 5, and 6, an example in which the optical apparatus 100 shown in FIG. 1 is embodied will be described below. FIGS. 4A and 4B schematically show the arrangement of a part of the optical apparatus 100 according to the embodiment of the present invention. The optical apparatus 100 includes the optical component 1 corresponding to the optical component 132 of the optical apparatus 100 shown in FIG. 1. The optical component 1 is a concave mirror. The optical component 1 is made of low thermal expansion glass and has a diameter of 1,500 mm and a mass of 1,300 kg. The support mechanisms 2 and 3 are made of steel. The support mechanisms 2 and 3 include elastic bodies 13 and 14, respectively, on the contact surfaces with the optical component 1. As the elastic bodies 13 and 14, PTFE or polyamide is preferable. PTFE is excellent in that the friction coefficient is small, and polyamide is excellent in respect of workability. By attaching the elastic bodies 13 and 14, the elastic bodies 13 and 14 elastically deform so that the contact area between the optical component 1 and the support mechanisms 2 and 3 increases. Accordingly, it is possible to reduce the stress concentration on the optical component 1 and to prevent breakage of the optical component 1.

The support portions 4 and 5 of the manipulation mechanisms 6 and 7 are made of steel like the support mechanisms 2 and 3, and elastic bodies 15 and 16 are attached to the contact surfaces with the optical component 1. The manipulation mechanisms 6 and 7 can include link mechanisms 17 and 18 or linear motion mechanisms as driving mechanisms. The link mechanisms 17 and 18 are excellent in that the structure is simple, and the linear motion mechanisms are excellent in that they do not cause slippage at the contact surfaces of the manipulation mechanisms 6 and 7 with the optical component 1. Each of the driving mechanisms of the manipulation mechanisms 6 and 7 can include an actuator. The actuator is, for example, a stepping motor or an air cylinder. The stepping motor is excellent in that the speed control is easy, and the air cylinder is excellent in that it does not generate heat.

The assembly before shipment in the example shown in FIGS. 4A and 4B will be described. The optical component 1 is a concave mirror and is supported by the two support mechanisms 2 and 3 from below. The position of the optical component 1 is constrained in the X direction and the Z direction due to its own weight. The optical component 1 is further constrained in the ωY direction (rotation about the Y-axis) due to the frictional forces between the optical component 1 and the support mechanisms 2 and 3. In addition, constraint components 19, 20, and 21 with respect to the Y direction are provided at three positions on the outer edge portion of the optical component 1. Since the optical component 1 is constrained at the three positions with respect to the Y direction, it is also constrained in the ωX direction (rotation about the X-axis) and the ωZ direction (rotation about the Z-axis).

Next, a stress reduction operation associated with assembly before shipment will be described. The stress reduction operation is performed in the procedure shown in FIG. 3. First, in step S9, the optical component 1 is driven by the manipulation mechanism 6 such that the optical component 1 is separated from the support surface of the support mechanism 2 by 0.1 mm. Next, in step S10, the optical component 1 is driven by the manipulation mechanism 7 such that the optical component 1 is separated from the support surface of the support mechanism 3 by 0.1 mm. The amount by which the optical component 1 is separated from the support surface of the support mechanism 2 and the amount by which the optical component 1 is separated from the support surface of the support mechanism 3 can be made equal. This amount can be, for example, within the range from 0 mm (exclusive) to 10 mm (exclusive). In step S10, the optical component 1 is completely separated from the support surfaces of the support mechanisms 2 and 3. Next, in step S11, the support portion 4 of the manipulation mechanism 6 is lowered by the manipulation mechanism 6 such that the optical component 1 comes into contact with the support surface of the support mechanism 2. In step S12, the support portion 5 of the manipulation mechanism 7 is lowered by the manipulation mechanism 7 such that the optical component 1 comes into contact with the support surface of the support mechanism 3.

Then, the optical apparatus 100 is transported to the shipping destination and assembled. The stress reduction operation associated with this assembly is also performed in accordance with the same specification (FIG. 3) as the above-described stress reduction operation associated with the assembly before shipment. Here, it is sufficient that the stress reduction operation before shipment and the stress reduction operation after shipment are performed in accordance with the same specification, and the specification can be changed as long as this condition is satisfied.

The manipulation mechanisms 6 and 7 may not include driving mechanisms (actuators). In that case, the support portions 4 and 5 of the manipulation mechanisms 6 and 7 can be lifted and lowered manually. For example, bolts for lifting and lowering the support portions 4 and 5 may be provided, and the support portions 4 and 5 may be lifted and lowered by manually rotating the bolts. Here, "manually" can include an operation performed using a tool. In such an operation, the amounts by which the optical component 1 is separated from the support portions 4 and 5 may be managed by inserting spacers having a predetermined thickness (for example, 0.1 mm) between the support portions 4 and 5 and the optical component 1. When driving mechanisms (actuators) are incorporated into the manipulation mechanisms 6 and 7, the driving mechanisms can be controlled by a driving program according to the above-described specification. Operational errors can be eliminated by controlling the driving mechanisms (actuators) of the manipulation mechanisms 6 and 7 by the driving program. When the operation is performed manually, for example, it may be necessary for an operator to enter the inside of the optical apparatus 100. In this case, it may be necessary to remove a large number of components to secure a work space. In addition, there is a possibility of warming up the optical apparatus 100 with the body temperature of the operator and changing the optical performance. Therefore, it may be necessary to wait until the temperature returns to its original value after the operation. These disadvantages can be solved by providing driving mechanisms (actuators) in the manipulation mechanisms 6 and 7.

Referring to FIG. 5, the deformation of the optical component 1 caused depending on the manipulation of the optical component 1 by the manipulation mechanisms 6 and 7 will be described. Note that in FIG. 5, the deformation of the optical component 1 is emphasized. In step S51, a state in which the optical component 1 is supported by the manipulation mechanisms 6 and 7 but not by the support mechanisms 2 and 3 is shown. In step S52, a state in which the left manipulation mechanism 6 is operated such that the optical component 1 comes into contact with the left support mechanism 2 is shown. At this time, the optical component 1 rotates about the contact portion with the right manipulation mechanism 7 as the rotation center and comes into contact with the left support mechanism 2, so that the center of the optical component 1 moves from a position 22 to a position 23. That is, the optical component 1 is in contact with the support surface of the left support mechanism 2 in a state in which its center is eccentric to the left side from the axis of symmetry of the support mechanisms 2 and 3. A reaction force 25 is generated between the optical component 1 and the left support mechanism 2, leading to generation of a frictional force. Accordingly, in the optical component 1, the vicinity of the portion in contact with the support surface of the left support mechanism 2 elastically deforms.

In step S53, a state in which the right manipulation mechanism 7 is operated such that the optical component 1 comes into contact with the right support mechanism 3 as well is shown. A reaction force 26 is generated between the optical component 1 and the right support mechanism 3, leading to generation of a frictional force. Accordingly, in the optical component 1, the vicinity of a portion in contact with the support surface of the right support mechanism 3 elastically deforms. In addition, the center of the optical component 1 moves from the position 23 to a position 24. At this time, since the optical component 1 is in contact with the support surface of the right support mechanism 3 while the influence of the left elastic deformation remains, the right elastic deformation becomes different from the left elastic deformation. That is, the optical component 1 has asymmetric deformation on the left and right. According to the simulation, when the optical component 1 is supported by the support mechanisms 2 and 3 in the driving procedure as shown in FIG. 5, a maximum difference of 12.0 nm occurred in comparison with the case in which the optical component 1 is supported by the support mechanisms 2 and 3 so as to come into contact with the support mechanisms 2 and 3 completely at the same time.

When the optical component 1 and the support mechanisms 2 and 3 are perfect rigid bodies and each of them has a zero friction coefficient, they are irrelevant to the driving order of the manipulation mechanisms 6 and 7 and asymmetrical deformation of the optical component 1 does not occur. However, in practice, the optical component 1 and the support mechanisms 2, 3 are elastic bodies and each of them has a non-zero friction coefficient so that asymmetrical deformation of the optical component 1 occurs. Therefore, it is desirable to operate the manipulation mechanisms 6 and 7 such that the optical component 1 comes into contact with the support mechanisms 2 and 3 as simultaneously as possible.

Figure 6:
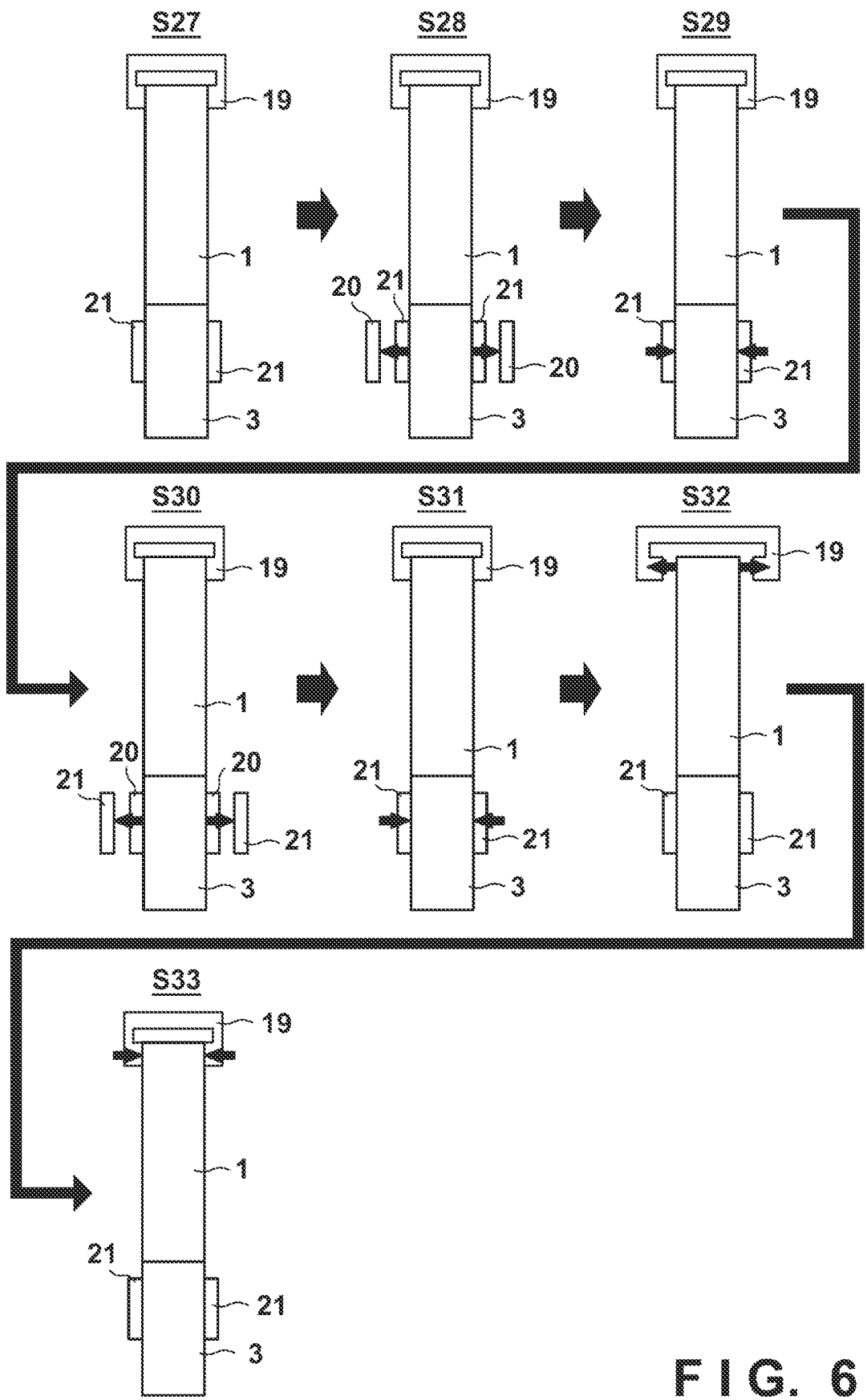
FIG. 6 is a view illustrating a procedure of bringing a constraint component (a type of support mechanism) into contact with an optical component.

FIG. 6 illustrates a procedure for bringing the constraint components 19, 20, and 21 (a type of support mechanism) into contact with the optical component 1. Frictional forces are also generated between the optical component 1 and the constraint components 19, 20, and 21, which can deform the optical component 1 by generating stress in the optical component 1. Accordingly, in order to decrease the deformation of the optical component 1, it is desirable to decrease the frictional forces between the optical component 1 and the constraint components 19, 20, and 21, thereby reducing the stress in the optical component 1. Such an operation is also a stress reduction operation.

Similar to the stress reduction operation for reducing the stress by the support mechanisms 2 and 3, the stress reduction operation for reducing the stress by the constraint components 19, 20, and 21 can also be performed in accordance with the same specification before shipment and after shipment. That is, both the stress reduction operation before shipment and the stress reduction operation after shipment can be performed in accordance with the specification shown in FIG. 6. Of course, as long as the stress reduction operation before shipment and the stress reduction operation after shipment are performed in accordance with the same specification, they may be performed in accordance with the specification different from the specification shown in FIG. 6.

Here, the specification shown in FIG. 6 will be described. The stress reduction operation is performed in the order of steps S27, S28, S29, S30, S31, S32, and S33. In steps S27, S28, and S29, the state of the optical component 1 is changed from the supported state in which the constraint component 20 supports the optical component 1 to the unsupported state in which the constraint component 20 does not support the optical component 1, and then to the supported state in which the support component 20 supports the optical component 1. Next, in steps S29, S30, and S31, the state of the optical component 1 is changed from the supported state in which the constraint component 21 supports the optical component 1 to the unsupported state in which the constraint component 21 does not support the optical component 1, and then to the supported state in which the constraint component 21 supports the optical component 1. In steps S31, S32, and S33, the state of the optical component 1 is changed from the supported state in which the constraint component 19 supports the optical component 1 to the unsupported state in which the constraint component 19 does not support the optical component 1, and then to the supported state in which the constraint component 19 supports the optical component 1.

Figure 7:
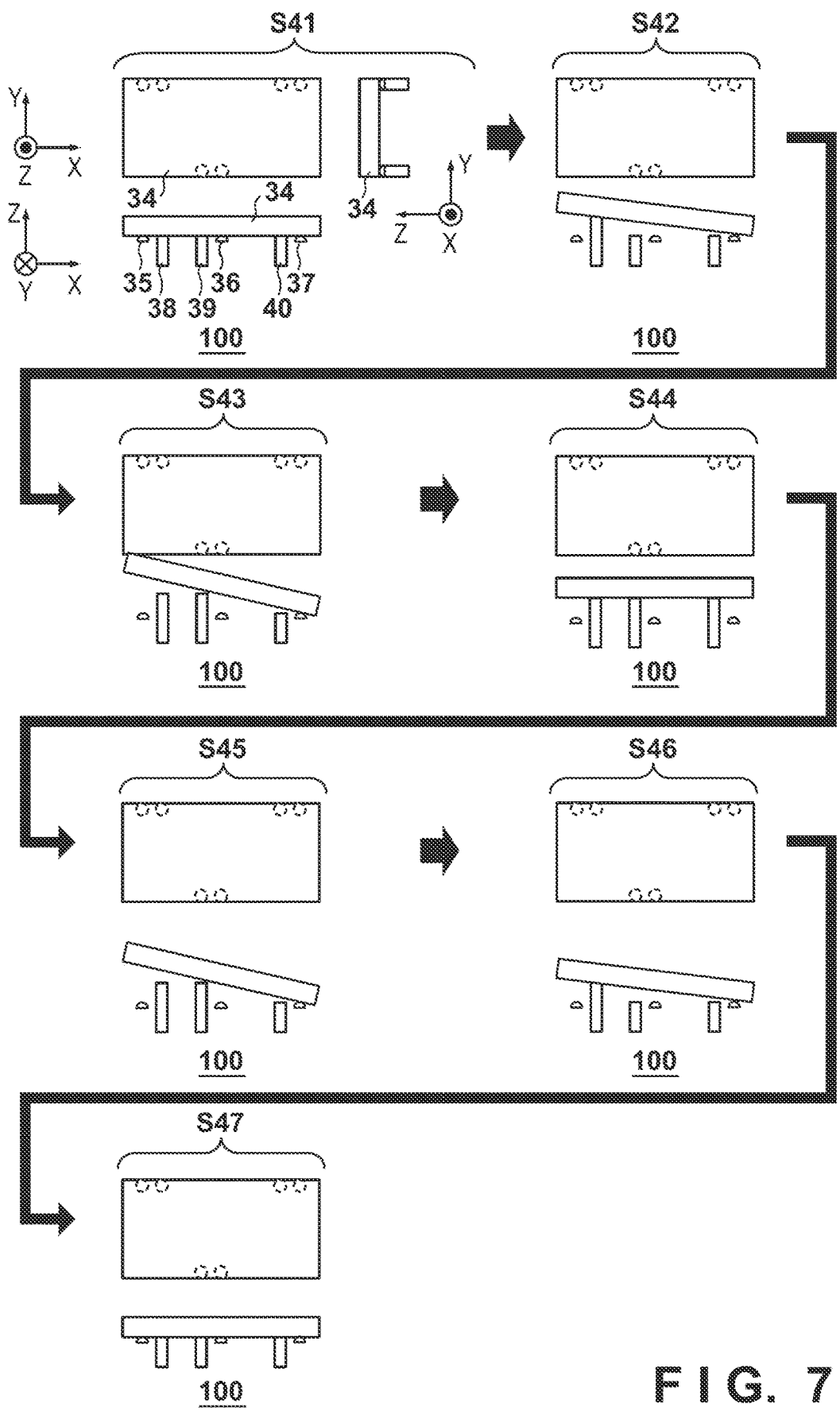
FIG. 7 is a view schematically showing another example of the present invention.

Referring to FIG. 7, another example in which the optical apparatus 100 shown in FIG. 1 is embodied will be described below. FIG. 7 schematically shows the arrangement of a part of the optical apparatus 100 according to the embodiment of the present invention. The optical apparatus 100 includes an optical component 34 corresponding to the optical component 134 or 135 of the optical apparatus 100 shown in FIG. 1. The optical component 34 is a refractive optical component (lens). The optical component 34 is made of synthetic quartz and has a dimension in the Y direction of 450 mm, a dimension in the X direction of 900 mm, a dimension in the Z direction (thickness) of 30 mm, and a mass of 25 kg. The optical apparatus 100 includes support portions 35, 36, and 37 as support mechanisms and actuators 38, 39, and 40 as manipulation mechanisms. Each of the support portions 35, 36, and 37 is made of POM and has a hemispherical shape. The actuators 38, 39, and 40 are preferably stepping motors or air cylinders. The stepping motor is excellent in that the speed control is easy, and the air cylinder is excellent in that it does not generate heat. Each of the actuators 38, 39, and 40 may have a resin member on the contact surface with the optical component 34 in order to prevent breakage of the optical component 34.

FIG. 7 illustrates the stress reduction operation of the optical apparatus 100 before shipment and after shipment. Here, the stress reduction operation of the optical apparatus

100 before shipment and the stress reduction operation of the optical apparatus 100 after shipment can be the same.

The optical component 34 is supported by the three support portions 35, 36, and 37 from below such that its thickness direction coincides with the Z direction. The optical component 34 is constrained in the Z direction due to its own weight. In addition, since the optical component 34 is supported by the support portions 35, 36, and 37 at three positions, the optical component 34 is also constrained in the ωX direction and the ωY direction. The stress reduction operation is performed in the order of steps S41, S42, S43, S44, S45, S46, and S47. In step S42, the left actuator 38 is operated to separate the optical component 34 from the left support portion 35 by 0.1 mm. Next, in step S43, the central actuator 39 is operated to separate the optical component 34 from the central support portion 36 by 0.1 mm. Then, in step S44, the right actuator 40 is operated to separate the optical component 34 from the right support portion 37 by 0.1 mm. Note that the separation amount is not limited to 0.1 mm, and it is sufficient that the left and right separation amounts are equal. This amount can be, for example, within the range from 0 mm (exclusive) to 10 mm (exclusive). Through steps S42, S43, and S44, the optical component 34 is completely separated from the support portions 35, 36, and 37 as the support mechanisms, and set to a state in which it is supported by the actuators 38, 39, and 40 as the manipulation mechanisms.

In step S45, the right actuator 40 is operated to make the optical component 34 being supported by the right support portion 37 and the central actuator 39. In step S46, the central actuator 39 is operated to make the optical component 34 being supported by the right support portion 37 and the left actuator 38. In step S47, the left actuator 38 is operated to make the optical component 34 being supported by the support portions 35, 36, and 37. Here, the stress reduction operation is performed by operating the actuators 38, 39, and 40, but the stress reduction operation may be performed by manually manipulating bolts or the like instead of the actuators 38, 39, and 40.

Figure 8:
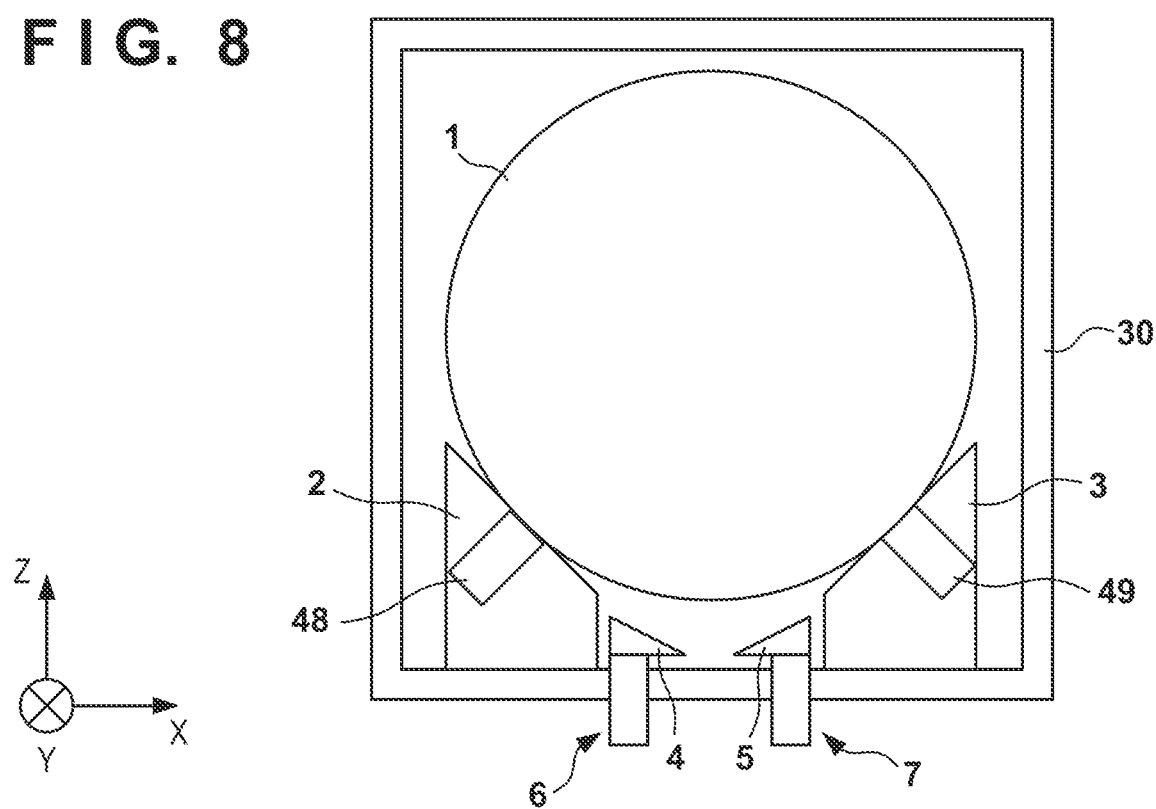
FIG. 8 is a view schematically showing the arrangement of an optical apparatus according to another embodiment of the present invention.

FIG. 8 schematically shows the arrangement of an optical apparatus 100 according to another embodiment of the present invention. The optical apparatus 100 shown in FIG. 8 can constitute, for example, all or part of the optical apparatus 100 shown in FIG. 1. The optical apparatus 100 shown in FIG. 8 includes sensors 48 and 49 for measuring the displacement or shape of an optical component 1. The sensors 48 and 49 can be, for example, displacement sensors for measuring the displacement of the optical component 1. In an example, the sensors 48 and 49 can be configured to measure the gap amounts between the optical component 1 and the support surfaces of the support mechanisms 2 and 3. As the sensors 48 and 49, a contact type sensor or a non-contact type sensor can be adopted. The contact type sensor is excellent in that the reproducibility of the origin position is good. The non-contact type sensor is excellent in that the measurement can be performed even when the measurement surface is small since it is unnecessary to bring the contact terminal into contact with the measurement surface.

When performing the stress reduction operation of the optical component 1, it is possible to operate manipulation mechanisms 6 and 7 while feeding back the results measured by the sensors 48 and 49 to the manipulation mechanisms 6 and 7. In this case, the stress reduction operation of the optical component 1 can be performed with higher accuracy than in the case in which the manipulation mechanisms 6 and 7 are operated by open loop control, and the stress reduction operation before shipment and the stress reduction operation after shipment can be matched with high accuracy. Furthermore, by storing the results measured by the sensors 48 and 49, it is possible to facilitate investigation of the cause of the trouble.

Figure 9:
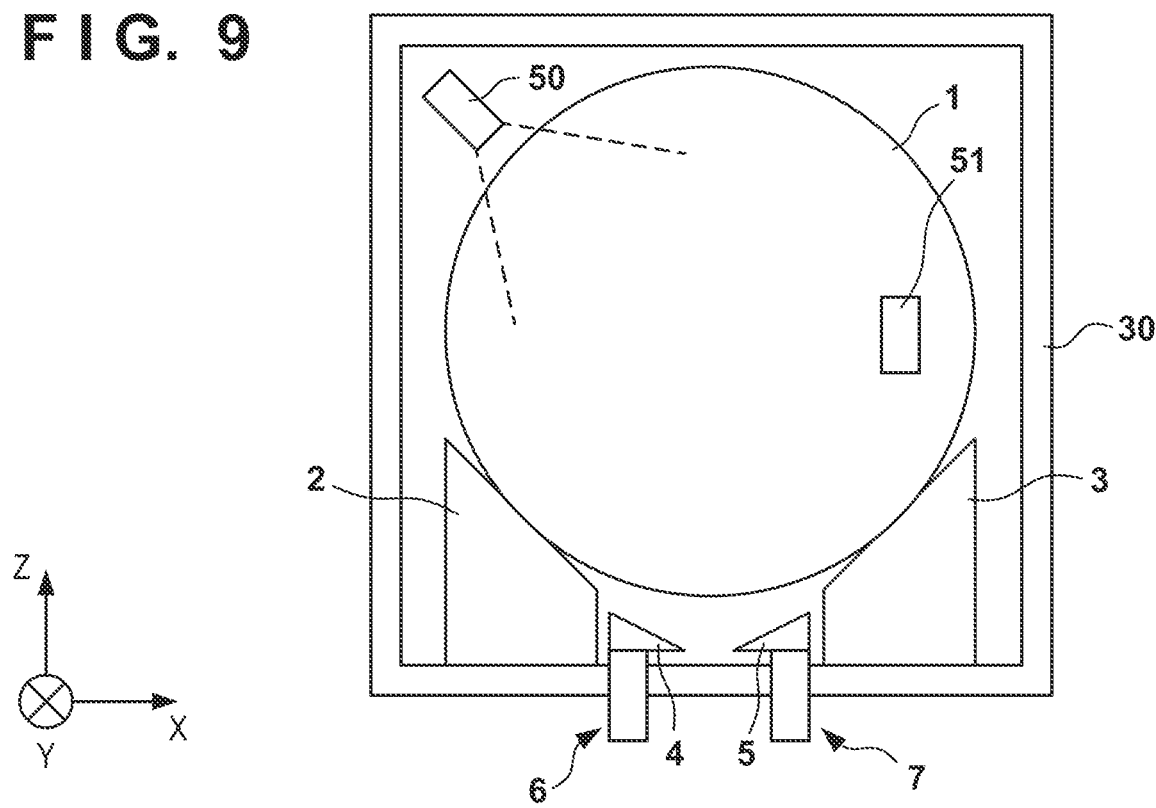
FIG. 9 is a view schematically showing the arrangement of an optical apparatus according to still another embodiment of the present invention.

FIG. 9 schematically shows the arrangement of an optical apparatus 100 according to still another embodiment of the present invention. The optical apparatus 100 shown in FIG. 9 can constitute, for example, all or part of the optical apparatus 100 shown in FIG. 1. The optical apparatus 100 shown in FIG. 9 includes sensors 50 and 51 for measuring the displacement or shape of an optical component 1. The sensors 50 and 51 can be, for example, shape sensors for measuring the shape of the optical component 1. The sensors 50 and 51 can be, for example, interferometers and/or strain gauges. In an example, the sensor 50 can be an interferometer and the sensor 51 can be a strain gauge. The interferometer is excellent in that it can directly measure the shape of the light beam reflecting surface of the optical component 1, and the strain gauge is excellent in that it can measure, though indirectly, the shape of the light beam reflecting surface of the optical component 1 with a simple arrangement.

In an example, a stress reduction operation is performed before shipment of the optical apparatus 100, and thereafter the shape of the optical component 1 can be measured using the sensors 50 and 51. Then, the optical apparatus 100 is shipped, and thereafter a stress reduction operation is performed in accordance with the same specification as before shipment and the shape of the optical component 1 can be measured using the sensors 50 and 51. After that, the shape of the optical component 1 measured using the sensors 50 and 51 before shipment and the shape of the optical component 1 measured using the sensors 50 and 51 after shipment can be compared. If the stress reduction operation before shipment and the stress reduction operation after shipment are performed correctly, the shape of the optical component 1 before shipment coincides with the shape of the optical component 1 after shipment. If the stress reduction operation before shipment and the stress reduction operation after shipment are not correctly performed, the shape of the optical component 1 before shipment does not coincide with the shape of the optical component 1 after shipment. In this case, the operation can be redone immediately so that the delay of operation can be suppressed.

On the other hand, when the sensors 50 and 51 are not provided, it is impossible to determine the failure of the stress reduction operation immediately after the stress reduction operation is performed. In this case, until various adjustment steps of the optical apparatus 100 are completed and the optical performance is confirmed, it may not be possible to recognize the failure of the stress reduction operation, which can cause the delay of operation.

A method of manufacturing an article (a semiconductor IC element, a liquid crystal display element, a MEMS, or the like) by using the optical apparatus 100 configured as an exposure apparatus will be described below. A process of exposing a substrate (a wafer, a glass substrate, or the like) applied with a photosensitive agent by using the exposure apparatus described above, a process of forming a pattern by developing the photosensitive agent on the substrate, and a process of processing the substrate using the pattern are performed, and an article is manufactured from the processed substrate. The other known processes include etching, resist removal, dicing, bonding, packaging, and the like.

An article of a higher quality than that of a related art can be manufactured according to this article manufacturing method.

The preferred embodiments of the present invention have been described above. However, the present invention is not limited to these embodiments, and various changes and modifications can be made within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-085720, filed Apr. 26, 2018, which is hereby incorporated by reference herein in its entirety.

What is claimed is:

1. A method of adjusting a state of an optical component using a support mechanism and a manipulation mechanism, the method comprising:
   a setting step of setting the state of the optical component to a first state in which the support mechanism supports the optical component without the manipulation mechanism supporting the optical component;
   a first changing step of changing the state of the optical component to a second state in which the manipulation mechanism supports the optical component; and
   a second changing step of changing the state of the optical component to the first state in which the support mechanism supports the optical component without the manipulation mechanism supporting the optical component.

2. The method according to claim 1, wherein the first changing step and the second changing step are performed to reduce stress in the optical component.

3. The method according to claim 1, wherein the setting step, the first changing step, and the second changing step are:
   performed in accordance with a predetermined specification before shipment of the optical apparatus, and
   further performed after shipment of the optical apparatus in accordance with the same specification as before the shipment.

4. The method according to claim 1, wherein the second state includes a state in which the manipulation mechanism supports the optical component without the support mechanism supporting the optical component.

5. The method according to claim 1, wherein the second state includes a state in which the support mechanism and the manipulation mechanism both support the optical component.

6. The method according to claim 1, wherein:
   the second state includes:
      a third state in which the support mechanism and the manipulation mechanism both support the optical component; and
      a fourth state in which the manipulation mechanism supports the optical component without the support mechanism supporting the optical component, and
   the first changing step includes changing the state of the optical component from the first state to the third state, then changing the state of the optical component to the fourth state, and then changing the state of the optical component to the third state, and
   the second changing step changes the state of the optical component from the third state to the first state.

7. The method according to claim 1, wherein:
   the optical apparatus further includes an enclosing member configured to enclose the optical component,
   the manipulation mechanism is configured to change the state of the optical component arranged in the enclosing member.

8. The method according to claim 1, wherein the manipulation mechanism includes a driving mechanism configured to drive the optical component.

9. The apparatus according to claim 1, wherein the first changing step is performed based on a measurement from a sensor configured to measure a displacement or a shape of the optical component.

10. The method according to claim 1, further comprising:
    a measurement step of measuring a displacement or a shape of the optical component, after the second changing step;
    a third changing step changing the state of the optical component from the first state to the second state; and then
    a fourth changing step of changing the state of the optical component to the first state.

11. The method according to claim 1, wherein the optical component is a component of an exposure apparatus configured to expose a substrate using the optical component.

12. A method of manufacturing an optical apparatus that comprises an optical component, a support mechanism configured to support the optical component, and a manipulation mechanism configured to manipulate the optical component to change a state of the optical component, the method comprising:
    a first setting step of setting the state of the optical component to a first state in which the support mechanism supports the optical component;
    a first changing step of changing the state of the optical component to a second state in which the manipulation mechanism supports the optical component after the first setting step;
    a second changing step of changing the state of the optical component to the first state in which the support mechanism supports the optical component after the first changing step;
    a first adjusting step of adjusting optical characteristics of the optical apparatus after the second changing step;
    a transporting step of transporting the optical apparatus after the first adjusting step;
    a second setting step of setting the state of the optical component to the first state in which the support mechanism supports the optical component after the transporting step;
    a third changing step of changing the state of the optical apparatus to the second state in which the manipulation mechanism supports the optical component after the second setting step; and
    a fourth changing step of changing the state of the optical apparatus to the first state in which the support mechanism supports the optical component after the third changing step.

13. The method according to claim 12, further comprising a second adjusting step of adjusting the optical characteristics of the optical apparatus after the fourth changing step.

14. A method of manufacturing an article using an exposure apparatus configured to expose a substrate using an optical component thereof, the method comprising:
    a setting step of setting a state of the optical component to a first state in which a supporting mechanism supports the optical component without a manipulation mechanism supporting the optical component;

a first changing step of changing the state of the optical component to a second state in which the manipulation mechanism supports the optical component;

a second changing step of changing the state of the optical component to the first state in which the support mechanism supports the optical component without the manipulation mechanism supporting the optical component;

an exposing step of exposing a substrate applied with a photosensitive agent with the exposure apparatus;

forming a pattern by developing the photosensitive agent; and processing the substrate using the pattern to manufacture the article from the substrate.

* * * * *